US011467508B2

(12) United States Patent
Wu et al.

(10) Patent No.: US 11,467,508 B2
(45) Date of Patent: Oct. 11, 2022

(54) PELLICLE ADHESIVE RESIDUE REMOVAL SYSTEM AND METHODS

(71) Applicant: Applied Materials, Inc., Santa Clara, CA (US)

(72) Inventors: Banqiu Wu, San Jose, CA (US); Eli Dagan, Sunnyvale, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 16/448,722

(22) Filed: Jun. 21, 2019

(65) Prior Publication Data

US 2020/0033740 A1    Jan. 30, 2020

Related U.S. Application Data

(60) Provisional application No. 62/703,239, filed on Jul. 25, 2018.

(51) Int. Cl.
*G03F 7/20* (2006.01)
*B08B 3/10* (2006.01)
(Continued)

(52) U.S. Cl.
CPC ............ *G03F 7/70925* (2013.01); *B08B 3/10* (2013.01); *G03F 7/70983* (2013.01);
(Continued)

(58) Field of Classification Search
CPC .... G03F 7/70925; G03F 7/70983; G03F 1/66; G03F 1/82; G03F 1/62; B08B 3/10;
(Continued)

(56) References Cited

U.S. PATENT DOCUMENTS 4,569,695 A    2/1986  Yamashita et al.
4,715,392 A    12/1987 Abe et al.
(Continued)

FOREIGN PATENT DOCUMENTS

JP    H07153730 A    6/1995
JP    2002124501 A   4/2002
(Continued)

OTHER PUBLICATIONS

PCT International Search Report and Written Opinion dated Oct. 11, 2019, for International Application No. PCT/US2019/039071.
(Continued)

*Primary Examiner* — Alexander Markoff
(74) *Attorney, Agent, or Firm* — Patterson + Sheridan LLP; B. Todd Patterson

(57) ABSTRACT

Embodiments of the present disclosure generally include apparatus and methods for removing adhesive residues from a surface of a lithography mask. In particular, the processing systems described herein provide for the delivery of a solvent to a discrete plurality of locations on the surface of the lithography mask to facilitate the removal of adhesive residue therefrom. In one embodiment, a method of processing a substrate includes positioning the substrate on a substrate support of a processing system, sealing individual ones of a plurality of cleaning units to a surface of the substrate at a corresponding plurality of locations, heating a cleaning fluid to a temperature between about 50° C. and about 150° C., flowing the cleaning fluid to, and thereafter, from, the plurality of cleaning units, and exposing the surface of the substrate to the cleaning fluid at the plurality of locations.

21 Claims, 5 Drawing Sheets

(51) Int. Cl.
  *H01L 21/67* (2006.01)
  *H01L 21/02* (2006.01)
  *G03F 1/82* (2012.01)
  *G03F 1/66* (2012.01)

(52) U.S. Cl.
  CPC .. *H01L 21/02082* (2013.01); *H01L 21/67028* (2013.01); *G03F 1/66* (2013.01); *G03F 1/82* (2013.01)

(58) Field of Classification Search
  CPC ......... H01L 21/02082; H01L 21/67028; H01L 21/6708; H01L 21/027; H01L 21/324; H01L 21/02041; H01L 21/67126; H01L 21/67248; H01L 21/67098; H01L 21/67276
  See application file for complete search history.

(56) References Cited

U.S. PATENT DOCUMENTS

| | | | |
|---|---|---|---|
| 5,099,557 A | 3/1992 | Engelsberg | |
| 5,271,798 A | 12/1993 | Sandhu et al. | |
| 5,800,625 A | 9/1998 | Engelsberg et al. | |
| 5,814,156 A | 9/1998 | Elliott et al. | |
| 6,063,208 A | 5/2000 | Williams | |
| 6,103,636 A | 8/2000 | Zahorik, deceased et al. | |
| 6,209,553 B1 | 4/2001 | Nagamura et al. | |
| 6,279,249 B1 | 8/2001 | Dao et al. | |
| 6,594,847 B1 | 7/2003 | Krusell et al. | |
| 6,908,567 B2 | 6/2005 | Uziel | |
| 7,008,487 B1* | 3/2006 | Hedges | B08B 3/02 134/182 |
| 7,673,637 B2 | 3/2010 | Pan | |
| 8,002,899 B2 | 8/2011 | Wu et al. | |
| 10,710,358 B2 | 7/2020 | Wu et al. | |
| 11,075,095 B2* | 7/2021 | Kobayashi | H01L 21/6708 |
| 2002/0125212 A1* | 9/2002 | Mertens | H01L 21/67028 216/57 |
| 2004/0197433 A1 | 10/2004 | Terada et al. | |
| 2005/0183754 A1 | 8/2005 | Kago et al. | |
| 2007/0132989 A1 | 6/2007 | Keller et al. | |
| 2007/0292775 A1 | 12/2007 | Hamada | |
| 2008/0057411 A1 | 3/2008 | Carpenter et al. | |
| 2008/0062414 A1* | 3/2008 | Chen | G03F 1/84 356/237.1 |
| 2008/0094591 A1 | 4/2008 | Eschbach et al. | |
| 2008/0124633 A1 | 5/2008 | Nagai et al. | |
| 2008/0131795 A1 | 6/2008 | Gallagher et al. | |
| 2010/0029088 A1* | 2/2010 | Mayer | C25F 3/12 438/748 |
| 2010/0078039 A1* | 4/2010 | Wu | G03F 1/82 134/1 |
| 2012/0219654 A1 | 8/2012 | Kim et al. | |
| 2012/0234363 A1* | 9/2012 | Cho | G03F 1/82 134/99.1 |
| 2015/0243533 A1* | 8/2015 | Semmelrock | H01L 21/67051 134/95.2 |
| 2017/0001223 A1* | 1/2017 | Lee | C11D 11/0047 |
| 2018/0031962 A1* | 2/2018 | Chou | B08B 3/10 |
| 2018/0136573 A1* | 5/2018 | Dattilo | G03F 1/82 |
| 2019/0181022 A1* | 6/2019 | Mouri | H01L 21/68742 |
| 2020/0009854 A1* | 1/2020 | Wu | G03F 7/70983 |
| 2020/0033740 A1* | 1/2020 | Wu | H01L 21/02082 |

FOREIGN PATENT DOCUMENTS

| | | |
|---|---|---|
| JP | 2010243796 A | 10/2010 |
| JP | 2012212032 A | 11/2012 |
| JP | 2012237838 A | 12/2012 |
| JP | 2016031412 A | 3/2016 |
| KR | 100834827 B1 | 6/2008 |
| KR | 101652825 B1 | 9/2016 |
| TW | 201543144 A | 11/2015 |
| TW | 201804242 A | 2/2018 |
| WO | 2018091604 A1 | 5/2018 |

OTHER PUBLICATIONS

Japanese Patent Application No. 2021-503098, Office Action dated Dec. 3, 2021.

Office Action dated Jul. 5, 2022 for Japanese Patent Application No. 2021-503098.

\* cited by examiner

PELLICLE ADHESIVE RESIDUE REMOVAL SYSTEM AND METHODS

CROSS-REFERENCE TO RELATED APPLICATIONS

This application claims priority to U.S. Provisional Application Ser. No. 62/703,239 filed on Jul. 25, 2018, which is herein incorporated by reference in its entirety.

BACKGROUND

Field

Embodiments described herein generally relate to the field of semiconductor device manufacturing, and in particular, to methods and apparatus used remove adhesive residues from a surface of a lithography mask.

Description of the Related Art

Semiconductor device manufacturing typically includes forming a plurality of interconnected patterned material layers on, over, and in the surface of a workpiece, e.g., a silicon wafer. Each of the patterned material layers are formed using a series of manufacturing processes which include patterning the workpiece surface or previously deposited material layers disposed on the workpiece surface. Often, the workpiece surface or the previously deposited material layers disposed on the workpiece surface are patterned using a lithography process. A typical lithography process includes transferring a pattern formed on the surface of a lithography mask to a resist layer coating the workpiece surface or the coating previously deposited material layers disposed thereon.

A lithography mask assembly, used in a lithography process, typically includes the lithography mask and a protective pellicle disposed over the patterned surface thereof. The pellicle includes a thin transparent membrane, i.e., a pellicle membrane which extends over the patterned surface of the lithography mask when the pellicle is secured thereto. The pellicle membrane is typically mounted on a pellicle frame which is secured to the patterned surface of the lithography mask by an adhesive, such as an epoxy resin. The pellicle membrane protects the patterned surface of the lithography mask from being contacted and thereby scratched during handling, and from exposure to environmental contaminants, such as dust. Typically, the pellicle membrane is spaced apart from the surface of the lithography mask by the pellicle frame so that any particles, e.g., dust, which become collected thereon are not in a field of focus when the lithography mask pattern is transferred to the resist layer on the substrate.

Pellicles desirably extend the useful lifetime of a lithography mask and are commonly replaced during cleaning or refurbishment processes related thereto. Typically, the used pellicle is separated from a lithography mask and discarded prior to cleaning or refurbishment of the lithography mask. Residues from the adhesive used to secure the used pellicle frame to the lithography mask surface are often removed before subsequent cleaning of the patterned surface of the mask to prevent undesirable transfer of the adhesive residue thereto. Unfortunately, the relatively low volatility adhesives suitable for use with the next generation of vacuum extreme ultra violet (EUV) lithography systems, have proven difficult to remove from EUV lithography mask surfaces without causing damage thereunto.

Accordingly, there is a need in the art for improved systems and methods for removing adhesive from the surface of a lithography mask.

SUMMARY

Embodiments of the present disclosure generally include apparatus and methods for removing adhesive residues from a surface of a lithography mask prior to cleaning or refurbishment of the lithography mask. In particular, the processing systems described herein provide for the delivery of a solvent to selective locations on the surface of the lithography mask to facilitate the removal of adhesive residue therefrom.

In one embodiment, a method of processing a substrate includes positioning the substrate on a substrate support of a processing system, sealing individual ones of a plurality of cleaning units to a surface of the substrate at a corresponding plurality of locations, heating a cleaning fluid to a temperature between about 50° C. and about 150° C., flowing the cleaning fluid to, and thereafter, from, the plurality of cleaning units, and exposing the surface of the substrate to the cleaning fluid at the plurality of locations.

In another embodiment, a computer readable medium has instructions stored thereon for a method of processing a substrate. The method includes positioning the substrate on a substrate support of a processing system, sealing individual ones of a plurality of cleaning units to a surface of the substrate at a corresponding plurality of locations, heating a cleaning fluid to a temperature between about 50° C. and about 150° C., flowing the cleaning fluid to, and thereafter, from, the plurality of cleaning units, and exposing the surface of the substrate to the cleaning fluid at the plurality of locations.

In another embodiment, a processing system includes a substrate support disposed in a processing volume and a fluid distribution assembly facing a substrate receiving surface of the substrate support. The fluid distribution assembly includes a support shaft having an inlet and an outlet, a manifold coupled to the support shaft, and a plurality of cleaning units coupled to the manifold. Here, individual ones of the cleaning units become sealed to a to-be-processed substrate when the substrate support and the fluid distribution assembly are disposed in a substrate processing mode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally include apparatus and methods for removing adhesive residues from a surface of a lithography mask prior to cleaning or refurbishing of the lithography mask. In particular, the processing systems described herein provide for the delivery of a solvent to selective locations on the surface of the lithography mask to facilitate the removal of adhesive residue therefrom.

Figure 1A:
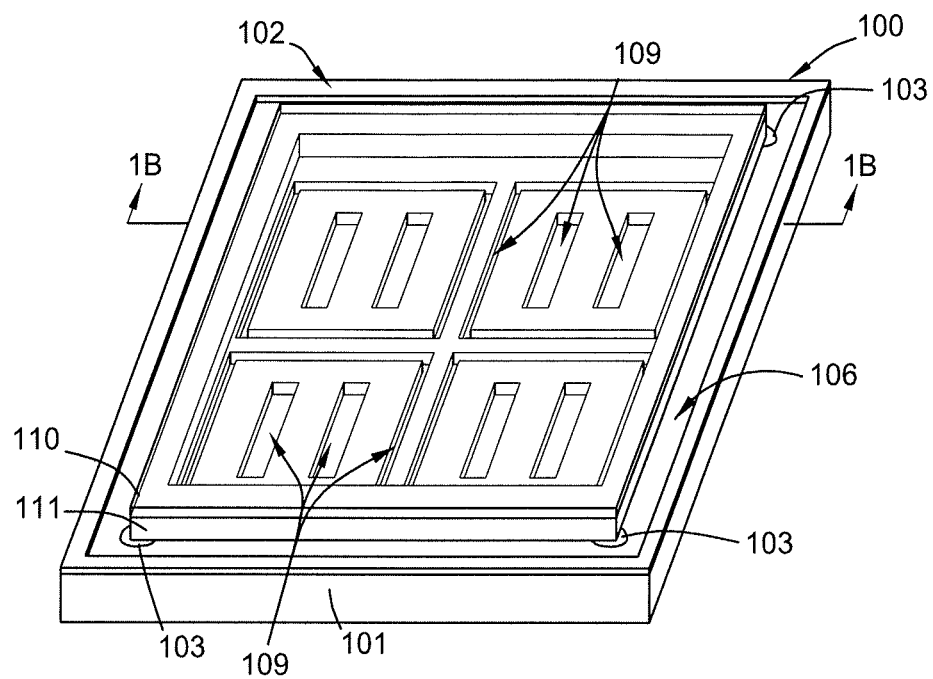
FIG. 1A is a schematic isometric view of an exemplary photomask assembly, according to one embodiment.
Figure 1B:
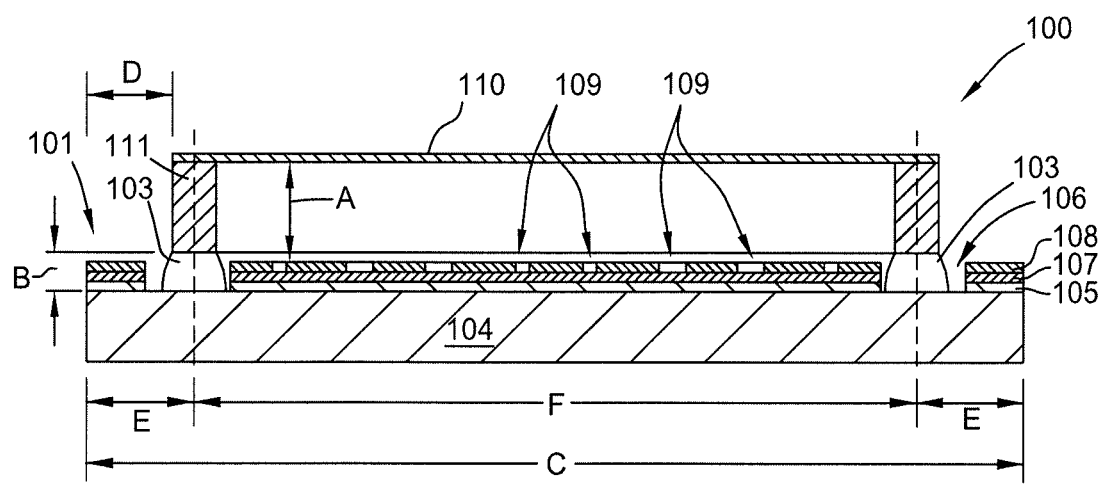
FIG. 1B is a cross-sectional view of the photomask assembly shown in FIG. 1A taken along line 1B-1B.

FIG. 1A is a schematic isometric view of an exemplary lithography mask assembly, according to one embodiment. FIG. 1B is a schematic cross-sectional view of the lithography mask assembly in FIG. 1A taken along line 1B-1B. Typically, the lithography mask assembly 100 includes a lithography mask 101 and a pellicle 102 secured thereto by a plurality of adhesive patches 103 interposed therebetween. In some embodiments the lithography mask 101 is configured for use with an extreme ultra violet (EUV) lithography processing system and features a substrate 104, a reflective multilayer stack 105 disposed on the substrate 104, a capping layer 107 disposed on the reflective multilayer stack 105, and an absorber layer 108 disposed on the capping layer 107. In some embodiments, the substrate 104 comprises a low thermal expansion material (LTEM), such as a titanium doped fused silica. In some embodiments, the reflective multilayer stack 105 comprises a plurality of repeating metal and silicon layers, such as a plurality of repeating Mo and Si layers, i.e., a plurality of Mo/Si layers. In some embodiments, the reflective multilayer stack 105 comprises more than about 40 alternating layers of metal and silicon and has a thickness of between about 200 nm and about 250 nm. In some embodiments, the absorber layer 108 is formed of a material comprising tantalum (Ta), such as a TaBO layer, a TaBN layer, or multilayer stack thereof, for example a TaBO layer disposed on a TaBN layer. In some embodiments, the absorber layer 108 has a thickness between about 50 nm and about 80 nm. In some embodiments, the capping layer 107 is formed of ruthenium (Ru) and has a thickness between about 1 nm and about 5 nm, for example about 2.5 nm.

Here, the absorber layer 108, having a plurality of openings 109 formed therethrough, forms a patterned surface of the lithography mask 101. Here, individual ones of the openings 109 extend through the absorber layer 108 to expose the capping layer 107 disposed therebeneath. In other embodiments, individual ones of the openings 109 further extend through the capping layer 107 to expose the reflective multilayer stack 105 disposed therebeneath. In some embodiments, the lithography mask 101 comprises one or more black-border openings 106, i.e., one or more openings extending through the absorber layer 108, the capping layer 107, and the reflective multilayer stack 105.

Typically, the pellicle 102 includes a thin (e.g., <200 nm in thickness) transparent membrane, herein a pellicle membrane 110, extending across a pellicle frame 111 and secured thereto by an adhesive layer (not shown) interposed therebetween. Herein, the pellicle membrane 110 is spaced apart from the surface of the lithography mask 101 by a distance A. The pellicle frame 111 is spaced apart from the surface of the lithography mask 101 by a thickness of the adhesive patches 103, herein a distance B of less than about 1 mm, such as between about 10 μm and about 500 μm. Here, the adhesive patches 103 are disposed directly on the surface of the substrate 104. In other embodiments, the adhesive patches 103 are disposed directly on the surface of the reflective multilayer stack 105. In other embodiments, the adhesive patches 103 are disposed directly on the surface of the absorber layer 108.

Spacing of the pellicle membrane 110 from the surface of the lithography mask 101 desirably prevents particles, e.g., dust, which become collected thereon from being in the field of focus when the lithography mask pattern is transferred to a resist layer on a workpiece. Spacing the pellicle frame 111 from the surface of the lithography mask desirably allows clean gas, e.g., air, to flow between the pellicle and the lithography mask. The free flow of gas between the pellicle and the lithography mask desirably prevents unequal pressures on the opposite surface of the membrane during a vacuum EUV lithography process which could cause the fragile pellicle membrane 110 to rupture. In embodiments herein, the adhesive patches 103 used to secure the pellicle 102 to the surface of the lithography mask 101 are disposed in patches at a discrete plurality of locations, such as proximate to the corners of the pellicle frame 111. For example, in some embodiments the lithography mask has a square shape in cross section where each side of the lithography mask has a length C of between about 100 mm and about 300 mm, for example about 150 mm. The sides of the pellicle frame 111 are disposed inwardly of the sides of the lithography mask 101 by a distance D of between about 0 mm and about 30 mm when measured at angles orthogonal thereto. Here, the plurality of adhesive patches 103 are disposed at the corners of the frame and have a center to center spacing F between about 70 mm and about 140 mm.

The pellicle 102, including the pellicle frame 111, is often replaced during the useful lifetime of the lithography mask 101 due to accumulation of particles on the front side and backside surfaces of the pellicle membrane 110, damage thereunto, or during other repair or refurbishment processing of the lithography mask 101. When a used pellicle 102 is removed from the surface of the lithography mask 101 at least some undesirable residue from the adhesive patches 103 will remain on the surface of the lithography mask at a discrete plurality of locations corresponding thereto. Unfortunately, the undesirable residue remaining on the surface of the lithography mask will transfer to other regions of the surface of the lithography mask during subsequent cleaning or refurbishment processes. Undesirably transferred residue may render the mask unusable or increase the cost and complexity of cleaning or refurbishing the mask. Further, unremoved residue can result in undesirable variation in the distance A between the lithography mask surface and the membrane of a subsequently mounted pellicle causing process defects related thereto or rendering the refurbished mask assembly unusable. Therefore, embodiments herein provide a processing system, described in FIGS. 2A-2C, and methods, set forth in FIG. 3, which facilitate removal of the undesirable adhesive residue from a plurality of selected locations on a lithography mask.

Figure 2A:
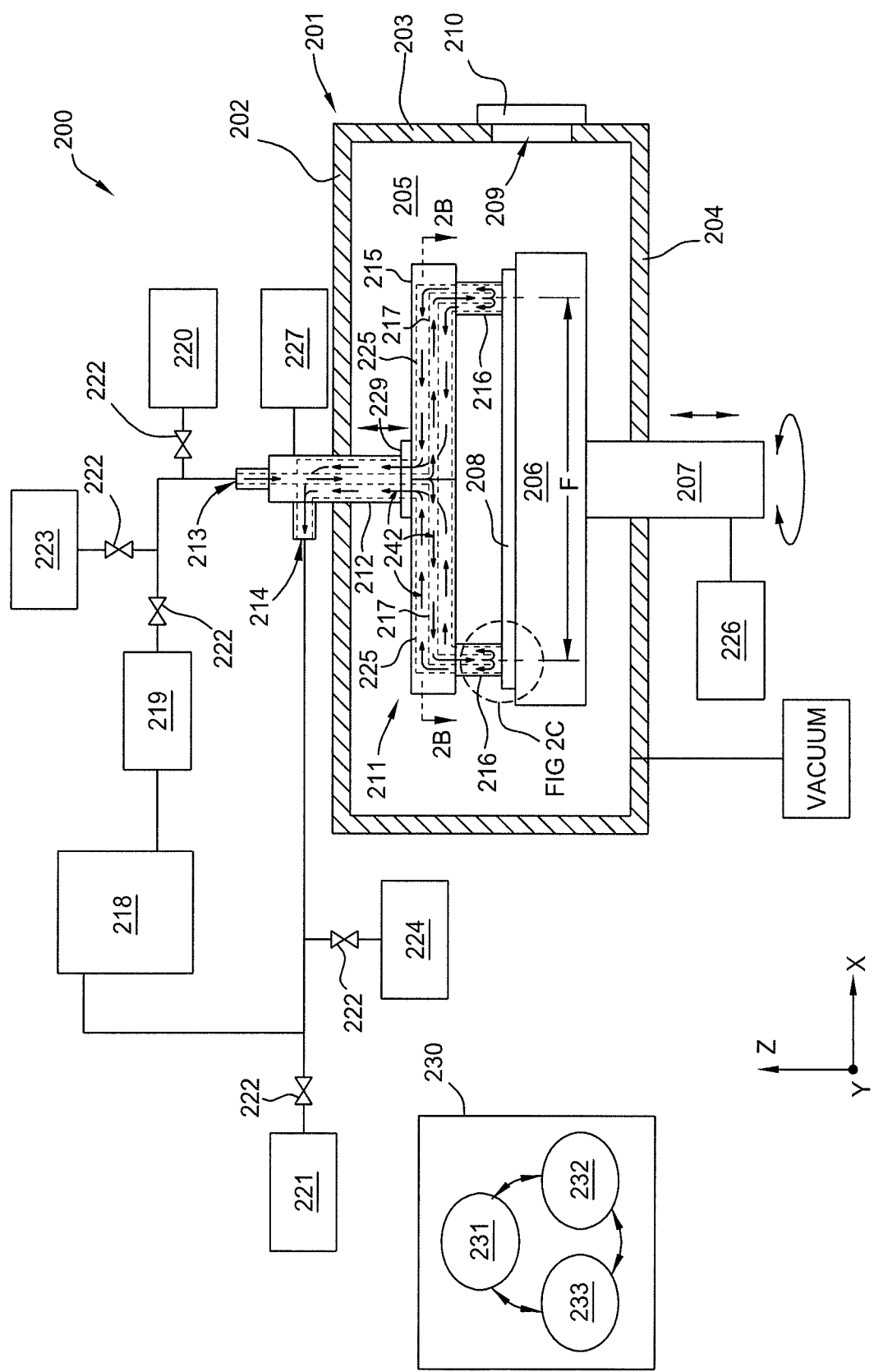
FIG. 2A is a schematic cross-sectional view of a processing system configured to practice the methods set forth herein, according to one embodiment.
Figure 2B:
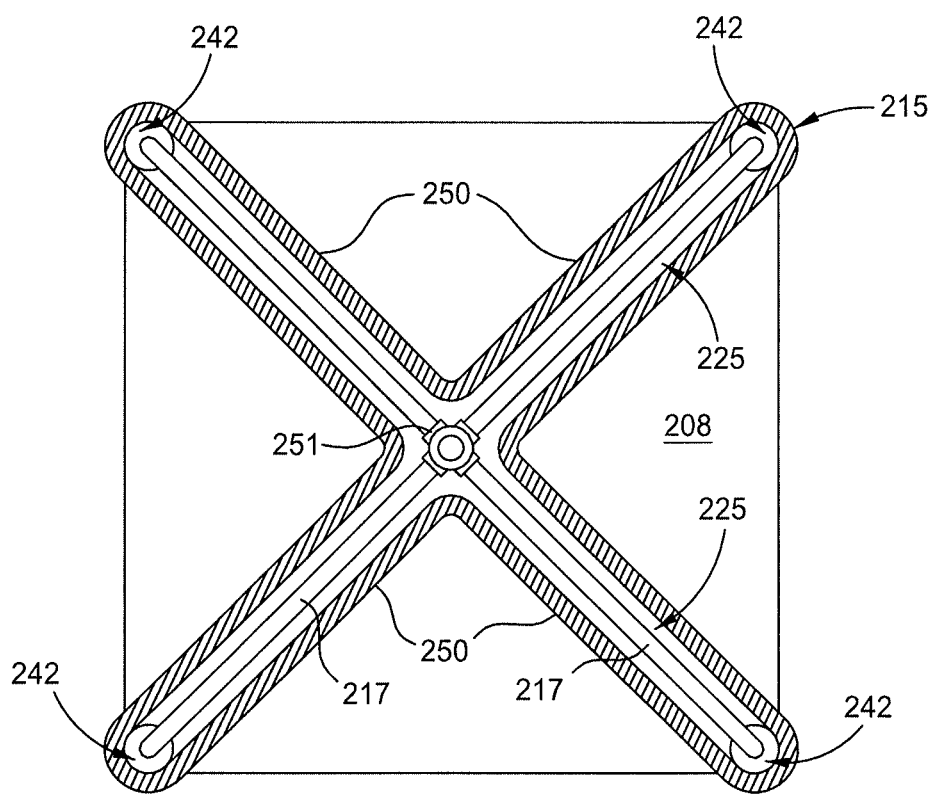
FIG. 2B is a sectional view of the fluid distribution assembly shown in FIG. 2A taken along line 2B-2B, according to one embodiment.
Figure 2C:
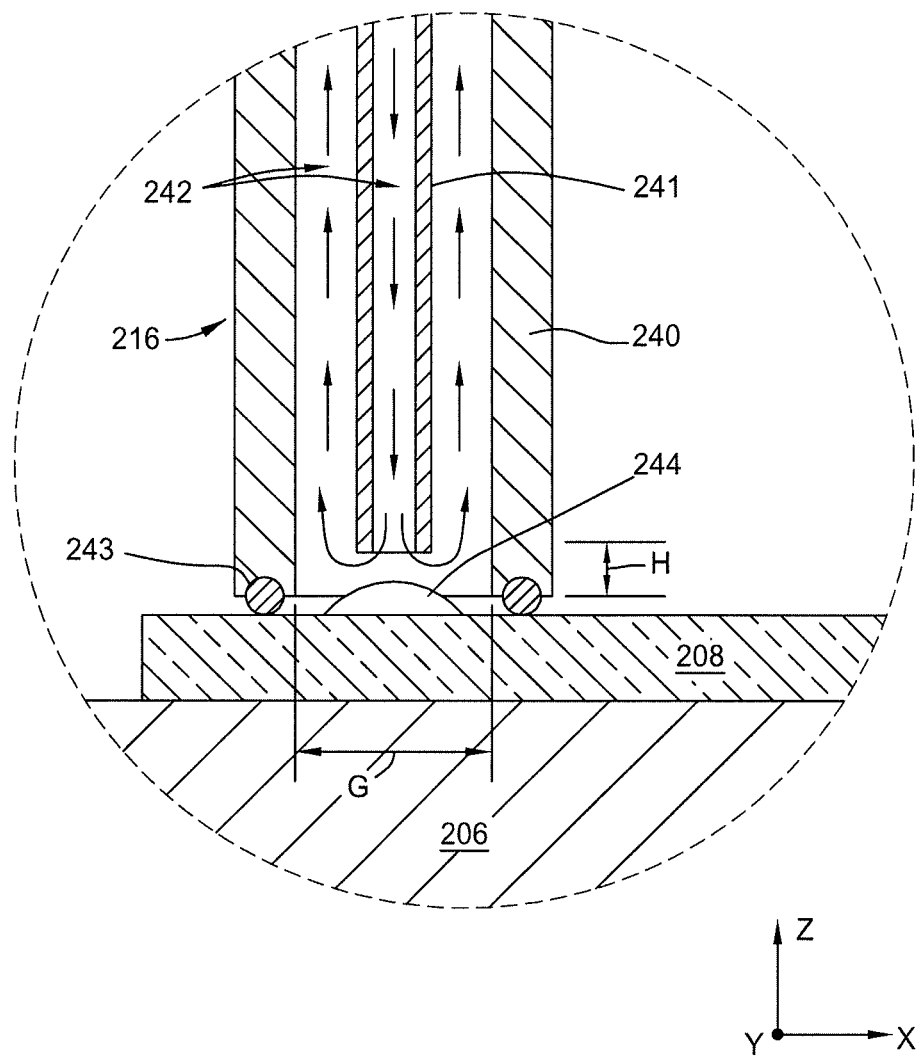
FIG. 2C is a close up view in cross section of a portion of the processing system shown in FIG. 2A, according to one embodiment.

FIG. 2A is a schematic cross-sectional view of a processing system configured to practice the methods set forth herein, according to one embodiment. FIG. 2B is a sectional view of the fluid distribution assembly shown in FIG. 2A taken along line 2B-2B, according to one embodiment. FIG. 2C is a close up view in cross section of a portion of the processing system shown in FIG. 2A, according to one embodiment.

Herein, the processing system 200 includes a body 201, a lid 202, one or more sidewalls 203, and a base 204 which collectively define the boundaries of a processing volume 205. A substrate support 206 disposed in the processing volume 205 is disposed on a support shaft 207 extending through the base 204. The processing system 200 is configured to facilitate transferring of a substrate 208, such as the lithography mask 101 described in FIGS. 1A-1B, to and from the substrate support 206 through an opening 209 in the one or more sidewalls 203. In some embodiments, the opening 209 is sealed with a door 210 during substrate processing.

Herein, the processing system 200 further includes a fluid distribution assembly 211 disposed above the substrate support 206. The fluid distribution assembly 211 features a fluid distribution shaft 212, a manifold 215 coupled to the fluid distribution shaft 212, and a plurality of cleaning units 216 coupled to the manifold 215. In some embodiments, such as in embodiments where the processing volume is maintained in a vacuum condition, the fluid distribution shaft 212 is sealingly disposed through the lid 202. For example, in some embodiments a bellows (not shown) surrounds the fluid distribution shaft 212 inside or outside of the processing volume 205. In some of those embodiments, the processing volume 205 is fluidly coupled to a vacuum, such as to one or more dedicated vacuum pumps.

Here, fluids enter the fluid distribution assembly 211 through an inlet 213 and exits the fluid distribution assembly 211 through an outlet 214. The manifold 215 distributes fluids received through the inlet 213 to the plurality of cleaning units 216 using a plurality of distribution conduits 217 disposed in fluid communication therebetween. The manifold 215 further directs fluids received back from the plurality of cleaning units 216 to the outlet 214 using a plurality of return conduits 225 disposed in fluid communication therebetween.

In some embodiments, the manifold 215 comprises a plurality of arms 250 (shown in FIG. 2B) which extend radially from a center axis thereof to the respective plurality of cleaning units 216. Here, each of the plurality of arms 250 have a return conduit 225 formed therein and a distribution conduit 217, such as a tube having an opening formed therethrough, disposed in the return conduit 225. In other embodiments, the manifold 215 is of any other suitable shape to facilitate fluid communication between the plurality of cleaning units 216 and the distribution shaft through the plurality of distribution conduits 217 and return conduits 225 respectively disposed and formed therein. In some embodiments, the inlet 213 comprises a tube having an opening disposed therethrough and the plurality of distribution conduits 217 are fluidly coupled to the inlet 213 using a spider fitting 251 (shown in FIG. 2B).

Here, the plurality of cleaning units 216 (further described in FIG. 2C) are positioned over a corresponding plurality of locations on the surface of the substrate 208. Here, each of the plurality of locations have a to-be-removed adhesive residue 244 (shown in FIG. 2C) disposed thereon. Herein, the plurality of cleaning units 216 and are sealed to the surface of the substrate 208 when the components in the processing system 200 are disposed in a substrate processing mode (as shown). Positioning the components in a substrate processing mode comprises one or both of raising the support shaft 207 or lowering the fluid distribution shaft 212 using one or both of a first actuator 226 or a second actuator 227 respectively coupled thereto. In some embodiments, the fluid distribution shaft 212 is sealingly coupled to the manifold 215 using a flexible coupling 229, such as a gimbal coupling, to facilitate sealing of the plurality of cleaning units to the substrate 208.

In some embodiments, the support shaft 207 is rotatable about a vertical axis disposed therethrough. In those embodiments, positioning the components in a substrate processing mode includes rotating the support shaft until the adhesive residue patches disposed on the substrate are desirably aligned with the plurality of cleaning units 216.

Here, the inlet 213 is fluidly coupled to one or more fluid sources, such as a cleaning fluid source 218, i.e., a solvent, a rinse fluid source 220, such as deionized water or isopropyl alcohol (IPA), and a drying gas source 223, such as clean dry air (CDA) or $N_2$. Cleaning fluid, rinse fluid, and drying gas from the respective fluid sources 218, 220, and 223 are selectively delivered to the inlet 213 using valves 222 disposed on the conduits fluidly coupled between the fluid source and the inlet 213, or a conduit leading to inlet 213. In some embodiments, the processing system 200 further includes a heater 219 disposed between and fluid communication with, the cleaning fluid source 218 and the inlet 213. In some embodiments, the cleaning fluid source 218 is a container and the cleaning fluid is recirculated thereinto from the outlet 214. In some embodiments, the heater 219 is a water bath or an oil bath having the cleaning fluid container disposed therein, or a shell and tube type heat exchanger. In some embodiments, rinse fluid or drying gas are respectively directed from the outlet 214 to a drain 224 or an exhaust 221 using the valves 222 disposed on the conduits fluidly coupled therebetween.

Typically, operation and control of the processing system 200 is facilitated using a system controller 230 coupled thereto. The system controller 230 includes a programmable central processing unit (CPU 231) that is operable with a memory 232 (e.g., non-volatile memory) and support circuits 233. The support circuits 233 are conventionally coupled to the CPU 231 and comprise cache, clock circuits, input/output subsystems, power supplies, and the like, and combinations thereof coupled to the various components of the processing system 200, to facilitate control thereof. The CPU 231 is one of any form of general purpose computer processor used in an industrial setting, such as a programmable logic controller (PLC), for controlling various components and sub-processors of the processing system 200. The memory 232, coupled to the CPU 231, is non-transitory and is typically one or more of readily available memories such as random access memory (RAM), read only memory (ROM), floppy disk drive, hard disk, or any other form of digital storage, local or remote.

Here, the memory 232 is in the form of a computer-readable storage media containing instructions (e.g., non-volatile memory), that when executed by the CPU 231, facilitates the operation of the processing system 200. The instructions in the memory 232 are in the form of a program product such as a program that implements the methods of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein).

Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure. In some embodiments, the methods described herein, or portions thereof, are performed by one or more application specific integrated circuits (ASICs), field-programmable gate arrays (FPGAs), or other types of hardware implementations. In some other embodiments, the processes described herein are performed by a combination of software routines, ASIC(s), FPGAs and, or, other types of hardware implementations.

FIG. 2C is a close-up view of a portion of FIG. 2A showing a cross-section of the cleaning unit 216, according to one embodiment. Here, the cleaning unit 216 includes a first, outer, conduit 240 and a second, inner, conduit 241 extending within the first conduit 240. Typically, an end of the second conduit 241 is recessed inwardly of the end of the first conduit 240 by a distance H between about 1 mm and about 20 mm. Here, the first conduit 240 has an inner diameter G larger than the diameter of a to-be-removed adhesive residue 244 disposed on the surface of the substrate 208, such as between about 1 mm and about 20 mm. During substrate processing a gasket 243, such as an O-ring, bellows, or a wiper seal, disposed at the end of the first conduit 240 contacts the substrate 208 and seals the end of the cleaning unit 216 to the substrate 208. For example, in some embodiments, the gasket 243 contacts a surface of the substrate 208 through an opening formed in the layers disposed thereon, such as the surface of the substrate 104 described in FIG. 1B. In other embodiments, the gasket 243 contacts a surface of a reflective multilayer stack 105 through openings formed in the absorber layer 108. When the end of the cleaning unit 216 is sealed to the substrate 208, i.e., when the components of the processing system are disposed in the substrate processing mode, the first conduit 240, the second conduit 241, and the portion of the substrate 208 surrounded by the gasket 243 will collectively define a fluid flow pathway 242.

Figure 3:
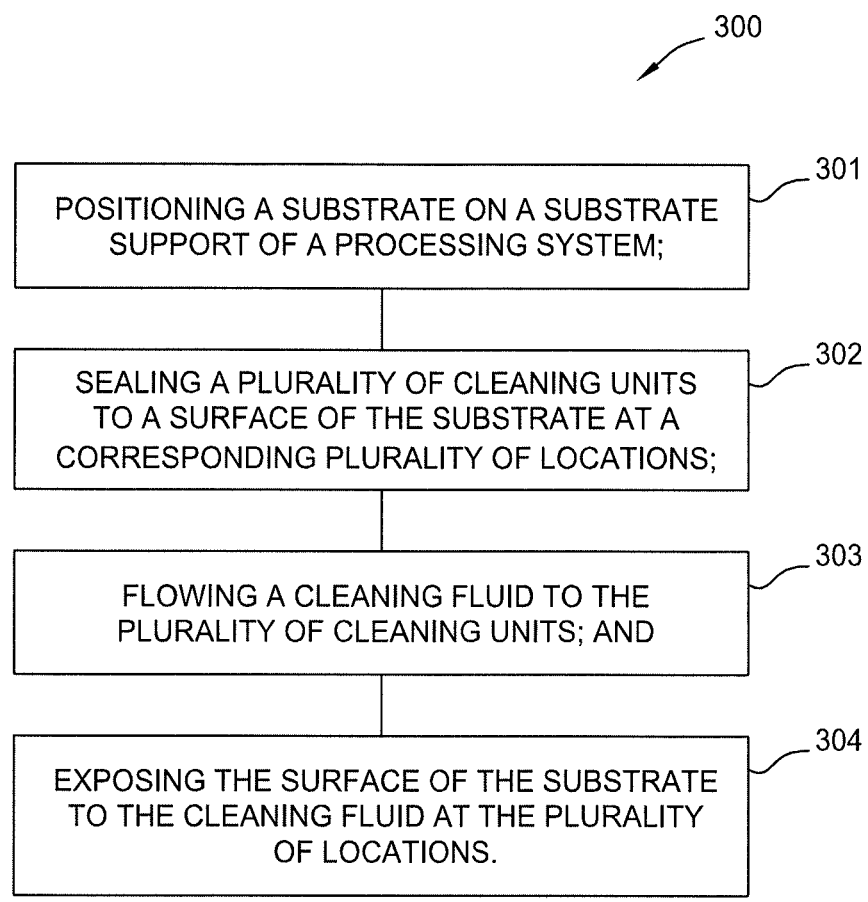
FIG. 3 is a flow diagram setting forth a method of cleaning adhesive residue from the surface of a substrate, according to one embodiment.

FIG. 3 is a flow diagram setting forth a method of cleaning adhesive residue from a plurality of locations on a surface of a substrate, such as the lithography mask 101 described in FIGS. 1A-1B. At activity 301 the method 300 includes positioning the substrate on a substrate support of a processing system, such as the processing system 200 described in FIGS. 2A-2C.

At activity 302 the method 300 includes sealing the ends of a plurality of cleaning units to a surface of the substrate at a corresponding plurality of locations. Here, sealing the ends of the plurality of cleaning units to the surface of the substrate comprises one or both of raising the substrate support or lowering a fluid distribution assembly until a plurality of gaskets disposed on the cleaning units sealingly contact the surface of the substrate.

At activity 303 the method 300 includes flowing a cleaning fluid through the plurality of cleaning units. In some embodiments, the cleaning fluid comprises an organic solvent. For example, in some embodiments, the cleaning fluid comprises one or a combination of dimethyl sulfoxide; 1-phenoxypropan-2-ol; 1-methyl-2-pyrrolidinonem; 2-phenoxyethanolm; 4-nonylphenol, branched, ethoxylated; dichloromethane; dimethylformamide; dichloromethane; methanol; or hydrotreated light distillate (hydrotreated petroleum distillate). In some embodiments, the cleaning fluid comprises one or a combination of the compositions A-D set forth in Table 1.

TABLE 1

| Composition | Chemical | vol. % |
|---|---|---|
| A | dimethyl sulfoxide | 75-95 |
|   | 1-phenoxypropan-2-ol | 5-25 |
| B | 1-methyl-2-pyrrolidinone | 75-95 |
|   | 2-phenoxyethanol | 5-20 |
| C | 4-nonylphenol, branched, ethoxylated | 0.5-2 |
|   | dichloromethane | 5-95 |
|   | dimethylformamide | 5-95 |
| D | dichloromethane | 60-90 |
|   | methanol | 5-20 |
|   | hydrotreated light distillate | 0.5-5 |

At activity 304 the method 300 includes exposing the surface of the substrate to the cleaning fluid at the plurality of locations. In some embodiments, the method 300 further includes heating the cleaning fluid to between about 50° C. and about 160° C., such as between about 50° C. and about 150° C., or between about 90° C. and about 150° C. In some embodiments, the method 300 further includes recirculating the cleaning fluid to a cleaning fluid source container. In some embodiments, the method 300 further includes flowing a rinsing fluid to the plurality of cleaning units and exposing the surface of the substrate to the rinsing agent at the plurality of locations. In some embodiments, the method 300 further includes flowing a drying gas to the plurality of cleaning units and exposing the surface of the substrate to the drying gas at the plurality of locations.

Typically, the gasket will have some residual cleaning fluid disposed thereon which may undesirably drip onto the substrate when the cleaning units are separated therefrom. Therefore, to prevent dripping, in some embodiments, the method 300 further includes maintaining a vacuum on the cleaning units while separating the cleaning units from the surface of the substrate.

The methods and processing systems described herein beneficially provide for the delivery of a solvent to selective locations on the surface of a EUV lithography mask to facilitate the removal of pellicle adhesive residue therefrom. Further, because solvents used herein can cause undesirable damage to the absorber layer of an EUV lithography mask, delivering the solvent to selective locations facilitates removal of the pellicle adhesive from the lithography mask using relatively aggressive solvents without causing undesirable damage to the fragile patterned surfaces disposed thereon.

While the foregoing is directed to embodiments of the present disclosure, other and further embodiments of the disclosure may be devised without departing from the basic scope thereof, and the scope thereof is determined by the claims that follow.

The invention claimed is:
1. A method of processing a substrate, comprising:
  positioning a substrate on a substrate support of a processing system, the processing system comprising:
    a lid, one or more sidewalls, and a base which collectively define a processing volume;

a line fluidly coupling the processing volume to a vacuum source;
the substrate support disposed in the processing volume; and
a fluid distribution assembly facing a substrate receiving surface of the substrate support, the fluid distribution assembly comprising:
a distribution shaft having an inlet and an outlet;
a manifold coupled to the distribution shaft; and
a plurality of cleaning units coupled to the manifold, each of the cleaning units comprising a first conduit having a first end, a gasket disposed on the first end, and a second conduit disposed in the first conduit, the second conduit having a second end that is recessed from the first end;
rotating the distribution shaft until each of the cleaning units is aligned with one of a corresponding plurality of locations of the substrate disposed on the substrate support;
moving one or both of the substrate support and the fluid distribution assembly towards one another to concurrently seal the first ends of the plurality of cleaning units against a surface of the substrate disposed on the substrate support;
sealing the plurality of cleaning units to the surface of the substrate at the corresponding plurality of locations;
heating a cleaning fluid to a temperature between about 50° C. and about 150° C.;
flowing the cleaning fluid to, and thereafter, from, the plurality of cleaning units; and
exposing the surface of the substrate to the cleaning fluid at the corresponding plurality of locations.

2. The method of claim 1, wherein the cleaning fluid comprises one of dimethyl sulfoxide, 1-phenoxypropan-2-ol, 1-methyl-2-pyrrolidinonem, 2-phenoxyethanolm, 4-nonylphenol, dichloromethane, dimethylformamide, dichloromethane, methanol, petroleum distillate, or a combination thereof.

3. The method of claim 1, wherein the substrate comprises:
a multilayer stack comprising a plurality of repeating metal and silicon layers; and
a patterned absorber layer disposed on the multilayer stack.

4. The method of claim 1, wherein the first conduit and the second conduit define a portion of a fluid flow pathway which extends from the inlet to the outlet of the distribution shaft.

5. The method of claim 1, wherein sealing the plurality of cleaning units to the surface of the substrate comprises raising the substrate support until the gasket of each cleaning unit of the plurality of cleaning units sealingly contacts the surface of the substrate.

6. The method of claim 1, wherein sealing the plurality of cleaning units to the surface of the substrate comprises lowering the fluid distribution assembly until the gasket of each cleaning unit of the plurality of cleaning units sealingly contacts the surface of the substrate.

7. A processing system, comprising:
a lid, one or more sidewalls, and a base which collectively define a processing volume;
a line fluidly coupled to the processing volume, wherein the line is configured to be fluidly coupled to a vacuum source;
a substrate support disposed in the processing volume; and
a fluid distribution assembly facing a substrate receiving surface of the substrate support, the fluid distribution assembly comprising:
a distribution shaft having an inlet and an outlet;
a manifold coupled to the distribution shaft; and
a plurality of cleaning units coupled to the manifold, each cleaning unit of the plurality of cleaning units comprising an outer conduit, a gasket disposed on a first end of the outer conduit, and an inner conduit, the inner conduit having a second end that is recessed from the first end,
wherein the distribution shaft is configured to rotate until each of the cleaning units is aligned with one of a corresponding plurality of locations of the substrate disposed on the substrate support, and one or both of the substrate support and the fluid distribution assembly are configured to move towards one another to concurrently seal the first ends of the plurality of cleaning units against a surface of the substrate disposed on the substrate support.

8. The processing system of claim 7, wherein
the substrate support is disposed on a support shaft, and
the support shaft is movably disposed through the base of the processing system.

9. The processing system of claim 7, wherein the distribution shaft is movable using an actuator coupled thereto.

10. The processing system of claim 7, further comprising a fluid heater fluidly coupled to the inlet of the distribution shaft.

11. The processing system of claim 7, wherein, for each cleaning unit of the plurality of cleaning units, the outer conduit, the inner conduit, and the surface of the substrate collectively define fluid flow pathway which extends from the inlet to the outlet of the distribution shaft.

12. The processing system of claim 7, further comprising:
a computer readable medium having instructions stored thereon for a method of processing a substrate, the method comprising:
positioning the substrate on the substrate support;
sealing the plurality of cleaning units to the surface of the substrate at a corresponding plurality of locations;
heating a cleaning fluid to a temperature between about 50° C. and about 150° C.;
flowing the cleaning fluid to, and thereafter, from, the plurality of cleaning units; and
exposing the surface of the substrate to the cleaning fluid at the corresponding plurality of locations.

13. The processing system of claim 12, wherein for each cleaning unit of the plurality of cleaning units, the outer conduit, the inner conduit, and the surface of the substrate collectively define a portion of a fluid flow pathway which extends from the inlet to the outlet of the distribution shaft.

14. The processing system of claim 13, wherein concurrently sealing the plurality of cleaning units to the surface of the substrate comprises raising the substrate support until the gasket disposed on the first end of the outer conduit of each cleaning unit of the plurality of cleaning units sealingly contacts the surface of the substrate.

15. The processing system of claim 13, wherein concurrently sealing the plurality of cleaning units to the surface of the substrate comprises lowering the fluid distribution assembly until the gasket disposed on the first end of the outer conduit of each cleaning unit of the plurality of cleaning units sealingly contacts the surface of the substrate.

16. The processing system of claim 15, wherein the distribution shaft is sealingly coupled to the manifold using a flexible coupling.

17. The processing system of claim 15, further comprising:
- a plurality of conduits fluidly coupled to the inlet; and
- a plurality of valves respectively disposed on the plurality of conduits, wherein the plurality of valves are configured to sequentially deliver different fluids to the distribution shaft from different fluid sources.

18. The processing system of claim 17, wherein the different fluid sources comprise a cleaning fluid source, a rinse fluid source, and a drying gas source.

19. The processing system of claim 18, wherein the cleaning fluid source comprises a solvent, the rinse fluid source comprises deionized water or isopropyl alcohol, and the drying gas source comprises clean dry air or nitrogen.

20. The processing system of claim 7, further comprising:
- a plurality of valves, wherein each value of the plurality of valves is disposed on one both of the outer conduit and the inner conduit, and is configured to direct drying gases from the outlet of the distribution shaft to an exhaust.

21. The processing system of claim 20, wherein the plurality of valves are further configured to direct rinse fluids from the outlet of the distribution shaft to a drain.

* * * * *